(12) United States Patent
Silva et al.

(10) Patent No.: US 9,334,167 B2
(45) Date of Patent: May 10, 2016

(54) NANOSTRUCTURE PRODUCTION METHODS AND APPARATUS

(75) Inventors: Sembukutiarachilage Ravi Silva, Camberley (GB); Ben Poul Jensen, Seaford (GB); Guan Yow Chen, Guildford (GB)

(73) Assignee: SURREY NANOSYSTEMS LIMITED, East Sussex (GB)

( * ) Notice: Subject to any disclaimer, the term of this patent is extended or adjusted under 35 U.S.C. 154(b) by 1900 days.

(21) Appl. No.: 11/920,280

(22) PCT Filed: May 11, 2006

(86) PCT No.: PCT/GB2006/001726
§ 371 (c)(1),
(2), (4) Date: Mar. 17, 2008

(87) PCT Pub. No.: WO2006/120449
PCT Pub. Date: Nov. 16, 2006

(65) Prior Publication Data
US 2009/0061217 A1  Mar. 5, 2009

(30) Foreign Application Priority Data
May 11, 2005 (GB) .................................. 0509499.0

(51) Int. Cl.
*C23C 16/46* (2006.01)
*C01B 31/02* (2006.01)
(Continued)

(52) U.S. Cl.
CPC ............. *C01B 31/0233* (2013.01); *B82Y 30/00* (2013.01); *B82Y 40/00* (2013.01); *C23C 16/46* (2013.01); *Y10T 428/265* (2015.01)

(58) Field of Classification Search
CPC .... C01B 31/0233; B82Y 40/00; B82Y 30/00; C23C 16/46
USPC .............................................. 427/248.1–255.7
See application file for complete search history.

(56) References Cited

U.S. PATENT DOCUMENTS 4,914,059 A   4/1990  Nissim et al. .................. 437/235
6,140,612 A * 10/2000  Husain et al. .................. 219/390
(Continued)

FOREIGN PATENT DOCUMENTS

CN   1448334   10/2003
EP   0 747 505  12/1996
(Continued)

OTHER PUBLICATIONS

Choi et al., "Low temperature synthesis of carbon nanotubes by microwave plasma-enhanced chemical vapor deposition," *Synthesis Metals* 108:159-163 (2000).
(Continued)

*Primary Examiner* — Michael Cleveland
*Assistant Examiner* — Michael G Miller
(74) *Attorney, Agent, or Firm* — Thomas | Horstemeyer, LLP (57) ABSTRACT

The present invention relates to a method of forming nanostructures or nanomaterials. The method comprises providing a thermal control barrier on a substrate and forming the nanostructures or nanomaterials. The method may, for example, be used to form carbon nanotubes by plasma enhanced chemical vapor deposition using a carbon containing gas plasma: The temperature of the substrate may be maintained at less than 350° C. while the carbon nanotubes are formed.

27 Claims, 9 Drawing Sheets

Schematic diagram of the direct current PECVD system, according to the present invention and contained embodiments.

(51) Int. Cl.
   *B82Y 30/00*   (2011.01)
   *B82Y 40/00*   (2011.01)

(56) References Cited

U.S. PATENT DOCUMENTS

| | | |
|---|---|---|
| 6,858,197 B1 | 2/2005 | Delzeit ............... 423/447.3 |
| 6,863,942 B2* | 3/2005 | Ren et al. ............... 428/36.9 |
| 2004/0037972 A1* | 2/2004 | Simon ............... B82Y 30/00 427/575 |
| 2004/0149209 A1* | 8/2004 | Dai et al. ............... 118/715 |
| 2004/0152240 A1* | 8/2004 | Dangelo ............... 438/122 |
| 2004/0241339 A1 | 12/2004 | Anazawa et al. ............... 427/488 |
| 2004/0253167 A1* | 12/2004 | Silva et al. ............... 423/447.1 |
| 2005/0064204 A1* | 3/2005 | Lalli et al. ............... 428/428 |
| 2005/0079659 A1* | 4/2005 | Duan et al. ............... 438/197 |
| 2005/0109280 A1 | 5/2005 | Chen et al. ............... 118/724 |
| 2006/0018820 A1 | 1/2006 | Little ............... 423/445 |

FOREIGN PATENT DOCUMENTS

| | | |
|---|---|---|
| EP | 1 190 987 | 3/2002 |
| JP | 2000313608 | 11/2000 |
| JP | 2001192829 | 7/2001 |
| JP | 2001192830 | 7/2001 |
| KR | 2001057162 | 7/2001 |
| WO | WO 03/011755 | 2/2003 |
| WO | WO 2006/120449 | 11/2006 |

OTHER PUBLICATIONS

Colomer et al., "Purification of catalytically produced multi-wall nanotubes," *J. Chem. Soc. Faraday Trans.* 94(24): 3753-3758 (1998).

Ebbesen, Carbon Nanotubes Preparation and Properties: Purification of Carbon Nanotubes, CRC pp. 154-159 (1997).

Hong et al., "In-situ synthesis of carbon naotubes on organic polymer substrates at atmosphere pressure," *Adv. Mater.* 14(9):676-679 (2002).

Jung et al., "Preparation of carbon nanotubes on Ni/Fe alloy substrates and its application," *Proc. Int. Disp. Workshops* 7:1023-1026 (2000).

Kang et al., "Low temperature growth of multi-wall carbon nanotubes assisted by mesh potential using a modified plasma enhanced chemical vapor deposition system," *Chemical Physics Letters* 349:196-200 (2001).

Kumar et al., "Realization of different carbon nanostructures by a microwave plasma enhanced chemical vapor deposition technique," *Applied Surface Science* 182:326-332 (2001).

Sano et al., "Self-organization of PEO-graft-single-walled carbon nanotubes in solutions and Langmuir-Blodgett films," *Langmuir* 17(17):5125-5128 (2001).

Show et al., "Formation of carbon nanotube by using RF plasma CVD equipment from acetylene and hydrogen gases," *Mat. Res. Soc. Symp. Proc.* 66:A13. 12.1-A13.12.6 2001.

Teo et al., "The significance of plasma heating in carbon nanotube and nanofiber growth," *Nano Letters* 4(5):921-926 (2004).

Vigolo et al., "Macroscopic fibers and ribbons of oriented carbon nanotubes," *Science* 290:1331-1334 (2000).

Wang et al., "Synthesis of multi-walled carbon nanotubes by microwave plasma-enhanced chemical vapor deposition," *Thin Solid Films* 390:130-133 (2001).

\* cited by examiner

Figure 1: Schematic diagram of the direct current PECVD system, according to the present invention and contained embodiments.

Figure 2: (A) Schematic of sample layout utilising titanium thermal barrier, according to an embodiment of the present invention, (B) Simulation of effect of temperature containment as an effect of thermal barrier layer thickness.

Figure 3: Typical scanning electron micrograph (SEM) of Carbon nanotubes produced at below 350°C temperature in direct current acetylene/nitrogen/hydrogen plasma on Ni catalyst particles, according to an embodiment of the present invention.

Figure 4: (A) Typical transmission electron micrograph (TEM) of a direct current PECVD produced nanotube and (B) High magnification of nanotube showing aligned graphene walls along nanotube axis, produced according to an embodiment of the present invention.

Figure 5: Schematic diagram of the alternative setup of PECVD system, depicting multiple power source.

Figure 6: Schematic illustration of using nanotubes as 'cross-wafer' vias (interconnects) in microelectronics. The thermal layer isolated the devices from the excessive temperatures.

Figure 7: Schematic illustration of an example where nanostructures are used as a sensing platform and the driving device and substrate is protected by the thermal barrier layer.

Figure 8: Schematic diagram of the alternative setup of PECVD system, using optical heating source.

Figure 9

NANOSTRUCTURE PRODUCTION METHODS AND APPARATUS

CROSS REFERENCE TO RELATED APPLICATIONS

The present application is a National Phase Application of International Application No. PCT/GB2006/001726, filed May 11, 2006, which claims priority to Great Britain Patent Application No. 0509499.0 filed May 11, 2005, which applications are incorporated herein fully by this reference.

FIELD OF THE INVENTION

This invention relates to a method of making nano structures at low substrate temperatures. More specifically, the invention concerns a method which uses a thermal control barrier and a heating source that heats the surface of the targeted substrate.

The term 'nanostructures' (NSs) is used herein as a generic term to embrace all metallic, semiconducting and insulating nanostructures which have high aspect ratio such as single-walled and multi-walled carbon nanotubes, carbon nanofibres, carbon nanofilaments, carbon nanoropes (ropes of carbon nanotubes), silicon and silicon oxide nanowire, gallium nitride nanowires, zinc oxide nanowire, etc. The term heat source is used herein as a generic term to represent all forms of heating such as resistive, optical, plasma, etc based.

BACKGROUND TO THE INVENTION

Nanostructures with high aspect ratios have great potential in a great variety of applications. Their small size resulting in quantum confinement, high aspect ratio, unique electrical, optical, mechanical properties, etc makes them highly desirable for applications such as interconnects, electrodes, sensors, nano-scale lasers, etc.

The existence of NSs is well documented in academic literature and is widely investigated. The NSs is reported to be synthesised by numerous techniques. An example is the carbon nanotube where the synthesis technique includes arc discharge, laser vaporisation, electron beam and catalytic pyrolysis. Other known methods are to use chemical vapour deposition (CVD) and plasma enhanced CVD (PECVD). Background information discussing carbon nanotubes is disclosed in prior art document 'Nanotubes for electronics' in the December 2000 issue of Scientific American (P. G. Collins et al.) pp. 38-45. This document discloses a method of CNT production, wherein a substrate is placed in a vacuum oven or flow tube, heated to temperatures of the order of 500° C. to 1200° C. and a carbon containing gas such as methane is introduced optionally in the presence of a transition metal-containing catalyst, whereupon it decomposes into, inter alia, carbon vapour. Some of the carbon vapour forms or condenses as carbon nanotubes. The catalytic process is similar to techniques used for synthesizing a wide variety of nanowires of different materials such as silicon nanowires where the catalysis is gallium and the feed gas is silane (S. Sharma and M. K. Sunkara, Nanotechnology 15 (2004) pp 130-134) and GaN nanowires using nickel as the catalyst and gallium and ammonia as the feed gas (F. Sammy, NNIN REU Research accomplishments (2004) pp 112)

The synthesis of these nanostructures has been restricted to high temperatures, usually above 500° C. One example is a technique for growing carbon nanotubes which is disclosed in the International patent application WO 99/65821, wherein a method of forming carbon nanotubes on materials such as glass, silica, quartz and silicon using Plasma Enhanced Chemical Vapour Deposition (PECVD) is disclosed. This 'hot filament' PECVD method uses high gas temperatures of between 300° C. and 700° C., so as to deposit carbon nanotubes on, for example, glass having a strain point temperature of 666° C. A heat filament situated above the material directly heats the material on to which the carbon nanotubes are deposited, the heat filament providing the energy required to produce the plasma above the substrate, and therefore provide the mechanism to disassociate the hydrocarbon gas and form carbon nanotubes using a catalyst. The glass onto which carbon nanotubes are deposited can then be used in the production of flat panel displays.

A method and system for controlled patterning and growth of single wall and multi-wall carbon nanotubes are known from U.S. Pat. No. 6,858,197. A substrate is coated with a first layer of a first selected metal and a second layer of a catalyst. Provision of the first layer enhances electrical conductivity associated with the carbon nanotube and also helps prevent lift-off of the catalyst in the second layer from the substrate. The gas temperatures are typically in the range 800-1100° C.

An alternative carbon nanotube fabricating system and method is known from US 2005/0109280. The nanotubes are formed in a substrate supported in a temperature regulated chuck. Immediately after the nanotubes have been formed, a cooling cycle is initiated to cool the back of the substrate.

Current techniques involve substantial substrate temperatures and this imposes severe limitations on application development. Recent research has been focused on moving towards lower synthesis temperature and one example is the technique disclosed in the International patent application WO 03/011755, wherein the making of carbon nanotubes at substrate temperatures down to room temperature is disclosed. The contents of WO 03/011755 are incorporated herein by reference in their entirety.

After the disclosure of WO 03/011755, there have been reports of similar techniques with low substrate temperatures below 300° C. as reported in 2003 issue of New journal of Physics (S. Hofmann, B. Kleinsorge, C. Ducati and J. Robertson) pp 153.1 and 2004 issue of Applied Physics Letter (T. M. Minea, S. Point, A. Granier and M. Touzeau) pp 1244 where both techniques show defective carbon nanotubes which we believe is due to the low temperature.

A further process for direct low-temperature synthesis of carbon nanotubes on substrate material are known from CN 1448334. This document discloses growing the carbon nanotubes directly on a multi-layered substrate. The three metal layers include one active metal catalyst layer sandwiched between one metal carrier layer on the substrate and one covering metal layer. The active metal catalyst is Fe, Co, Ni or their alloy, the metal carrier layer and the covering metal layer may be of Au, Ag, Cu, Pd, Pt or their alloy, and the three layers may be formed through vacuum sputtering, chemical vapour deposition, physical vapour deposition, screen printing or electroplating.

The present invention has been devised and modified to provide an improved low temperature PECVD process for the formation and growth of carbon nanotubes.

SUMMARY OF THE INVENTION

Viewed from a first aspect, the present invention relates to a method of forming nanostructures or nanomaterials comprising providing a thermal control barrier on a substrate and forming the nanostructures or nanomaterials. The thermal control barrier helps to ensure that the temperature of the substrate remains at a relatively low temperature and thereby increases the range of materials which may be used to form the substrate. Thus, the thermal control barrier reduces heating effects on the substrate. The temperature of the substrate is preferably less than 350° C. while the nanostructures or nanomaterials are formed.

At least in preferred embodiments of the present invention, it is now possible to deposit nanostructures or nanomaterials onto substrates at low temperatures while maintaining low defect levels, providing an increase in the commercial potential of carbon nanotube production, especially where nanostructures or nanomaterials are applied to commercially significant materials that could not be used with the known high temperature methods of deposition. The invention may also allow a higher yield and throughput in the synthesis of NSs due to increased growth rates.

The nanostructures or nanomaterials typically form on the thermal control barrier.

The thermal control barrier is preferably provided in a substantially continuous layer to ensure that the substrate is protected across its entire surface. The thermal control barrier may be applied using any suitable technique. Preferably, however, the thermal control barrier is deposited on to the substrate. For example, the thermal control barrier may be sputtered on to the substrate.

The thermal control barrier preferably has a substantially uniform thickness. The thermal control barrier preferably has a thickness of greater than or equal to 3 nm; 5 nm; 10 nm; 20 nm; 30 nm; 50 nm; 100 nm; or 200 nm. The thickness of the thermal control barrier may be increased in applications where additional protection is required. The thickness of the thermal control barrier may be 500 nm or more.

The thermal control barrier is preferably a metal (such as titanium), semiconductor or dielectric material.

The method according to the present invention preferably comprises the further step of providing a catalyst on the thermal control barrier to facilitate formation of the nanostructures or nanomaterials. The catalyst may be applied before the nanostructures or nanomaterials are formed; or simultaneously with the formation of nanostructures or nanomaterials. The catalyst may, for example, be provided in powder form, having a particulate size of between 0.1 μm and 1 μm. Conventional lithography techniques may be employed to pattern the catalyst.

The catalyst may be a metal, such as a transition metal. The catalyst may, for example, be a metal, or mixture of metals, from the group comprising nickel (Ni), cobalt (Co) and iron (Fe). Of course, the catalyst may be selected to promote the formation of a desired nanostructure. Nickel (Ni), iron (Fe) and cobalt (Co) are normally used for Carbon nanotubes growth; whereas Gallium (Ga) or gold (Au) may be used for Silicon nanowires. Likewise, different materials may be used for ZnO nanowires.

In certain embodiments, the thermal control barrier may be adequate to maintain the temperature of the substrate below 350° C. However, it may be appropriate also to perform the additional step of cooling the substrate. This may be performed by supplying a coolant, such as water or helium gas, to a cooling well. The thermal control barrier may be provided on a front face of the substrate and the back face of the substrate cooled. The step of cooling the substrate is preferably performed while the nanostructures or nanomaterials are formed. Most preferably, the step of cooling the substrate is performed substantially continuously throughout the process. The cooling is preferably controlled to ensure substantially uniform cooling of the substrate.

The temperature of the substrate may be less than 275° C.; 225° C.; 175° C. or 125° C. while the nanostructures or nanomaterials are formed. The temperature of the substrate is preferably at a maximum while the nanostructures or nanomaterials are being formed.

The cooling of the substrate could be initiated immediately the nanostructures or nanomaterials have been formed. Preferably, however, the cooling of the substrate is performed while the nanostructures or nanomaterials are formed. Thus, the thermal control barrier can maintain the substrate at a relatively low temperature whilst allowing the nanostructures or nanomaterials to form.

The plasma will cause the surface of the thermal control barrier and/or the catalyst to be heated. However, the method comprises the step of performing additional heating of the thermal control barrier and/or the catalyst. The additional heating may be performed, for example, by a laser; an infrared light; or a hot filament.

The thermal control barrier may be optically reflective. Thus, the barrier may reflect light, for example from an infrared lamp, to maintain the substrate cool and, if present, to promote heating of a catalyst. The thermal control barrier may by a thermal insulator. Of course, the thermal control barrier may be both optically reflective and a thermal insulator.

The method may comprise the additional step of providing at least one device on the substrate. The at least one device may, for example, be an electronic component, such as a transistor. The thermal control barrier is preferably provided over said at least one device. The at least one device is preferably at least substantially covered by said thermal control barrier. The nanostructures or nanomaterials may form interconnects between two or more such devices. One or more contact layers may be provided on the substrate to connect the nanostructures or nanomaterials to said at least one device.

The substrate may, for example, be a plastics material.

Viewed from a further aspect the present invention relates to a method of forming nanostructures or nanomaterials comprising providing a thermal control barrier over at least one device provided on a substrate and forming said nanostructures or nanomaterials. The nanostructures or nanomaterials are typically formed on the thermal control barrier.

The temperature of the substrate is preferably less than 350° C. while the nanostructures or nanomaterials are formed. The thermal control barrier may provide sufficient protection to maintain the temperature of the substrate at less than 350° C. without actively cooling the substrate. In certain embodiments, however, the method may comprise the step of cooling the substrate. The substrate is preferably cooled while the nanostructures or nanomaterials are formed. The substrate is preferably cooled uniformly.

The method includes the step of heating the thermal control barrier. Although the plasma used to form the nanostructures or nanomaterials will result in heating, additional heating is used.

The thermal control barrier is preferably provided in a substantially continuous layer. The thermal control barrier may be applied using any appropriate technique, but it is preferably sputtered on to the thermal control barrier. The thermal control barrier preferably has a thickness of greater than or equal to 3 nm; 5 nm; 10 nm; 20 nm; 30 nm; 50 nm; 100 nm; or 200 nm. The thermal control barrier may, for example, be a layer of titanium.

The at least one device provided on the substrate is preferably at least substantially covered by said thermal control barrier. The at least one device is preferably an electronic component, such as a transistor.

Viewed from a still further aspect, the present invention relates to a method of forming nanostructures or nanomaterials comprising providing a thermal control barrier on a first surface of the substrate and forming the nanostructures or nanomaterials, wherein a second surface of the substrate is cooled while said nanostructures or nanomaterials are formed. The nanostructures or nanomaterials are typically formed on the thermal control barrier.

The cooling of the second surface of the substrate is preferably performed uniformly over the whole of said surface. This helps to ensure uniform formation of the nanostructures or nanomaterials.

The temperature of the substrate is preferably less than 350° C. while the nanostructures or nanomaterials are formed. The thermal control barrier may provide sufficient protection to maintain the temperature of the substrate at less than 350° C. without actively cooling the substrate.

In certain embodiments, however, the method may comprise the step of cooling the substrate. The substrate is preferably cooled while the nanostructures or nanomaterials are formed. The second surface is preferably cooled by introducing a coolant into a cooling well. The method may include the additional step of introducing a gas at the interface between said second surface and a surface on which the substrate is supported. The gas may be hydrogen or helium.

The method includes the additional step of heating the thermal control barrier. Although the plasma used to form the nanostructures or nanomaterials will result in heating, additional heating is used.

At least one device is preferably provided on a first side of said substrate. The at least one device is preferably at least substantially covered by said thermal control barrier. The at least one device is preferably an electronic component, such as a transistor.

Viewed from a further aspect, the present invention relates to a method of forming nanostructures or nanomaterials, the method comprising forming the nanostructures or nanomaterials on a first surface of the substrate and cooling a second surface of the substrate; wherein a gas is introduced at an interface between said second surface and a surface on which the substrate is supported. The gas introduced at the interface is preferably hydrogen.

The surface on which the substrate is supported is preferably cooled to effect cooling of the second surface of the substrate. The surface may be cooled by introducing a coolant into a cooling well. Preferably, the second surface is cooled while said nanostructures or nanomaterials are formed.

The methods described herein may comprise the additional step of applying a catalyst to the thermal control barrier. The catalyst may be applied simultaneously with the formation of the nanostructures or nanomaterials or it may be applied before the nanostructures or nanomaterials are formed.

Viewed from a further aspect, the present invention relates to an assembly or structure for forming nanostructures or nanomaterials comprising a substrate and a thermal control barrier. The thermal control barrier preferably has a thickness of greater than or equal to 3 nm; 5 nm; 10 nm; 20 nm; or 30 nm.

At least one device, such as an electronic component, may be provided on the substrate.

Viewed from yet still further aspect, the present invention relates to an assembly for forming nanostructures or nanomaterials, the assembly comprising a substrate and at least one device; wherein a thermal control barrier at least substantially covers the substrate and said at least one device.

The at least one device may be an electronic component, such as a transistor. The assembly may further comprise a catalyst for forming nanostructures or nanomaterials.

The processes described herein may be repeated to build up a multi-layered structure, such as a microprocessor. Intermediate polishing steps may be performed to provide a suitable surface for providing a further thermal control barrier on which additional nanostructures or nanomaterials may be formed.

According to preferred embodiments of the present invention, there is provided a method of forming carbon nanotubes by plasma enhanced chemical vapour deposition using a carbon containing gas plasma, wherein the carbon nanotubes are not formed on a substrate at a temperature 350° C. or above. The carbon containing gas may be decomposed ex-situ of the growth environment, but enters the growth region in an excited or 'hot plasma' state such that it facilitates the growth process. The Carbon source would also be in the form of a plasma beam, or plasma arc, or molecular vapour with excited carbon ions or radicals. Obviously, with this invention, where the control over both heat to selective areas and material structure is attainable, could be extended to a host of other materials and applications.

The methods described herein allow for the synthesis of NSs to be carried out, optionally using selective heating from a heat source and containment of heat using thermal control barriers for effective thermal budget control. The process is generic for the growth of all forms of nanomaterials and nanostructures, such as nanotubes and nanowires, composed of metallic, semiconducting or insulating materials. The methods are suitable for manufacturing sensors and integrated circuits. The present invention as defined herein is not, however, to be interpreted as being limited to these particular applications.

The nanostructures produced in accordance with the methods described herein may, for example, be carbon nanotubes or carbon nanowires formed by plasma enhanced chemical vapour deposition using a carbon containing gas plasma.

Viewed from a further aspect, the present invention relates to apparatus for forming nanostructures or nanomaterials, the apparatus comprising a plasma chamber, at least one heat source and a chuck for mounting a substrate; wherein the chuck is interchangeable.

Viewed from a still further aspect, the present invention relates to apparatus for forming nanostructures or nanomaterials, the apparatus comprising a plasma chamber, at least one heat source and a chuck for mounting a substrate; wherein a cooling well is provided for uniformly cooling the substrate. The cooling well is preferably adapted to provide uniform cooling of the substrate while nanostructures or nanomaterials are formed. The apparatus preferably also comprises an outlet for supplying a gas to the interface between the chuck and a substrate mounted therein. A supply of gas, such as hydrogen or helium, is preferably provided.

The apparatus is preferably provided with RF and DC power supplies for selectively supplying power to the chuck. A switch may be provided to allow the appropriate power supply to be selected.

The terms thermal control barrier and thermal barrier used herein have the same meaning.

The present invention further relates to components/assemblies/apparatus made in accordance with the methods described herein.

BRIEF DESCRIPTION OF THE DRAWINGS

In order that the invention may be illustrated, and more easily appreciated and readily carried into effect by those skilled in the art, embodiments thereof will now be described by way of non-limiting example only, with reference to the accompanying drawings in which.

DETAILED DESCRIPTION OF PREFERRED EMBODIMENTS

Description of First Example

This example allows the deposition of low defect level carbon nanotubes, though not specifically, at low substrate temperature below 350° C. It should be clear to a skilled person that the invention can be extended to other materials.

Figure 1:
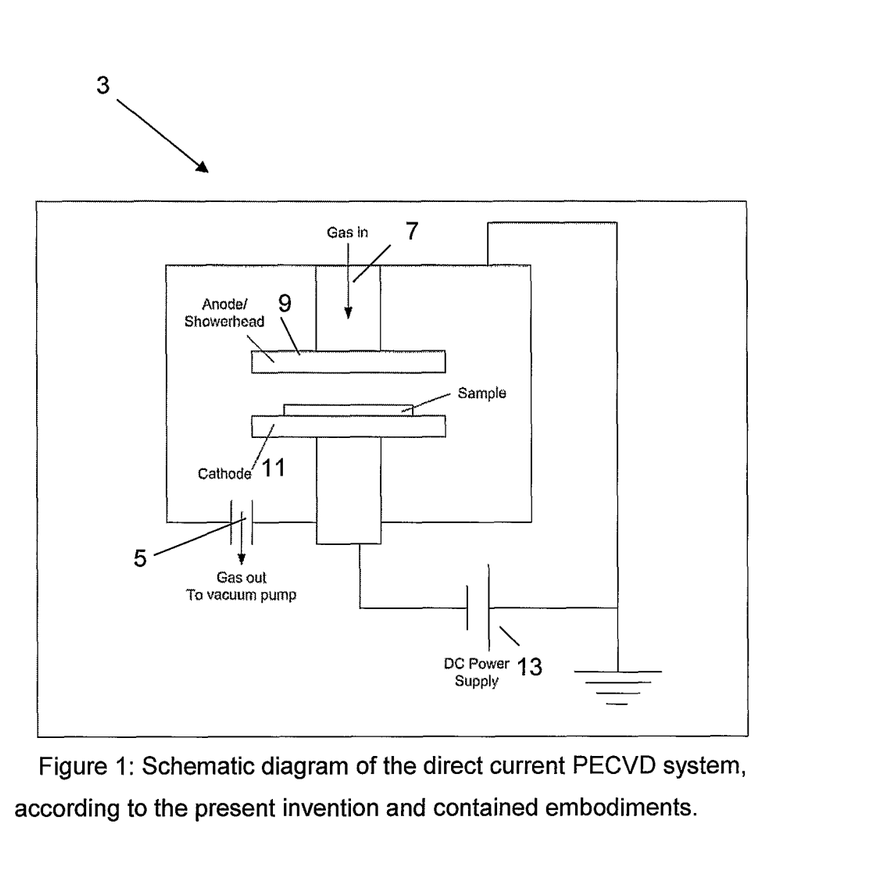
FIG. 1 is a schematic illustration of a suitable direct current plasma chamber for the forming and growing the carbon nanotubes upon a substrate according to an example.

Referring firstly to FIG. 1, the plasma chamber 1 of a home built direct current PECVD system 3 is used as shown. A vacuum chamber housing is capable of evacuation with the pressure being controlled by a manual leak valve (not shown) at the vacuum pump inlet 5. The chamber has a gas inlet 7 for receiving a flow of the required gas or gaseous mixture, typically a hydrocarbon gas such as acetylene, $C_2H_2$. It should be obvious to a skilled person that any carbon containing gas could be used.

An earthed electrode (anode) 9 is also part of the shower head is provided in the upper part of the chamber 1, whilst a powered (negatively biased) electrode (cathode) 11 is provided in the lower part of the chamber and connected to the appropriate power source 13. In this example, the power source used is a 600 W Glassman power supply unit (PSU).

Figure 2:
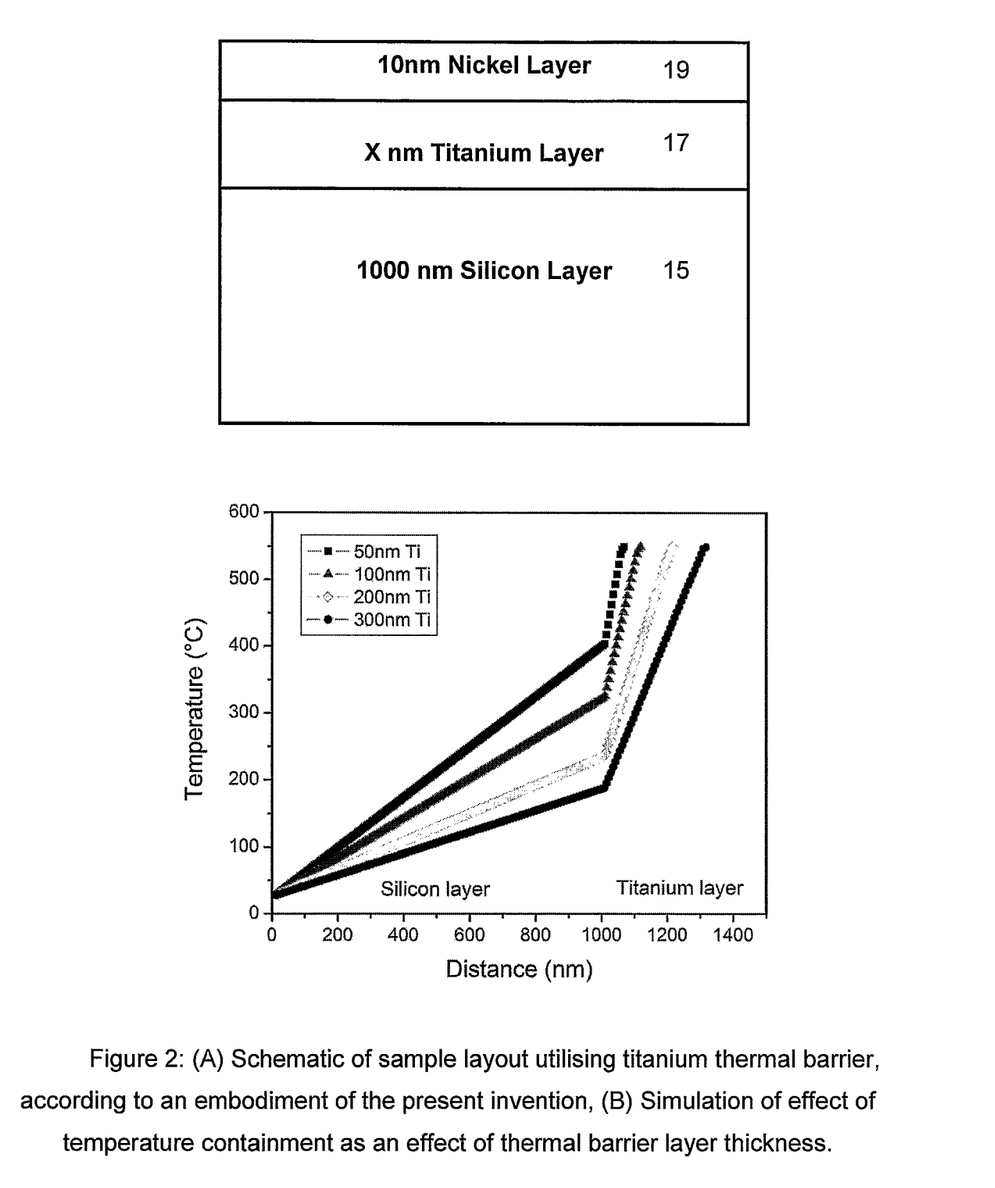
FIG. 2A is a schematic illustration of the nickel catalyst on a titanium thermal barrier layer, according to an example.
FIG. 2B is a graph of the simulation of the temperature containment effect of the thermal barrier as an effect of barrier thickness.

A substrate 15 is sputter coated with a 500 nm titanium thermal barrier layer 17 follow by nickel thin film layer 19 as illustrated in FIG. 2A. The nickel film layer 19 is a catalyst for the formation of NTs. The substrate 15 has a thickness of 1000 nm; and the catalyst 19 a thickness of 10 nm. The thermal control barrier 17 (in the form of titanium layer in this embodiment) is one which utilises the lower thermal conductivity properties. The substrate 15 used in this embodiment is a silicon substrate, but it will be obvious to a skilled person that any other substrate may be used. The choice of catalyst 19 and thermal barrier layer 17 is not limited to nickel and titanium as will be obvious to a skilled person.

The substrate 15 is placed on the lower electrode (cathode) 11 and the chamber 1 is evacuated. Acetylene, nitrogen and hydrogen gases are allowed to flow into the chamber 1 at a rate of 3, 100 and 100 sccm ($cm^3$/minute) respectively, using a suitable device such as a mass flow controller.

Direct current power is switched on at a voltage setting of 500V in order to strike a plasma. After the plasma is struck, the gas flow rate is adjusted to provide a working pressure of approximately 5 Torr and the direct current power supply is adjusted to operate at constant 550V to maintain the plasma. The potential difference to some extent determines the direction of growth and alignment of the carbon nanotubes.

It is the very high temperature of the plasma that provides the necessary energy to produce the required reaction of the gases in the chamber 1, thereby allowing the PECVD system to transport the disassociated hydrocarbon species and carbon ions to the substrate and initialize the CNT growth from the catalyst. Similarly, the heating of the surface is not limited to only the plasma and can be in the form of hot filament, infra-red lamps, laser, etc, as should be obvious to a skilled person.

The temperature of the substrate 15 on the electrodes 9, 11 during a plasma in this example is less than 350° C. This low substrate temperature allows for a wide variety of previously unused substrates to be used for carbon nanotube deposition. The substrate in the present example is not subjected to deliberate cooling. Therefore, it will be obvious to a skilled person that with a suitable cooling mechanism, the substrate temperature could be brought down to room temperature or below as illustrated in FIG. 2B.

During different process runs carried out, various temperatures ranging from 250 to 420° C. were used. Although it will be clear to a skilled person that higher or lower temperatures could be used. Also, various process times were used from 10 to 30 minutes. We have used typical working pressures of 1-10 Torr. But, this could be varied to suite the application by a person skilled in the art.

The characterisations of the nanotubes formed were performed on a Hitachi S-4000 field emission scanning electron microscope (SEM) and a Philips CM 200 transmission electron microscope (TEM). The samples studied by TEM were prepared by ultrasonic dispersion of 'as grown' samples in methanol, a drop of the suspension was then deposited on a holey carbon film supported on a copper grid. The samples were then allowed to dry.

Figure 3:
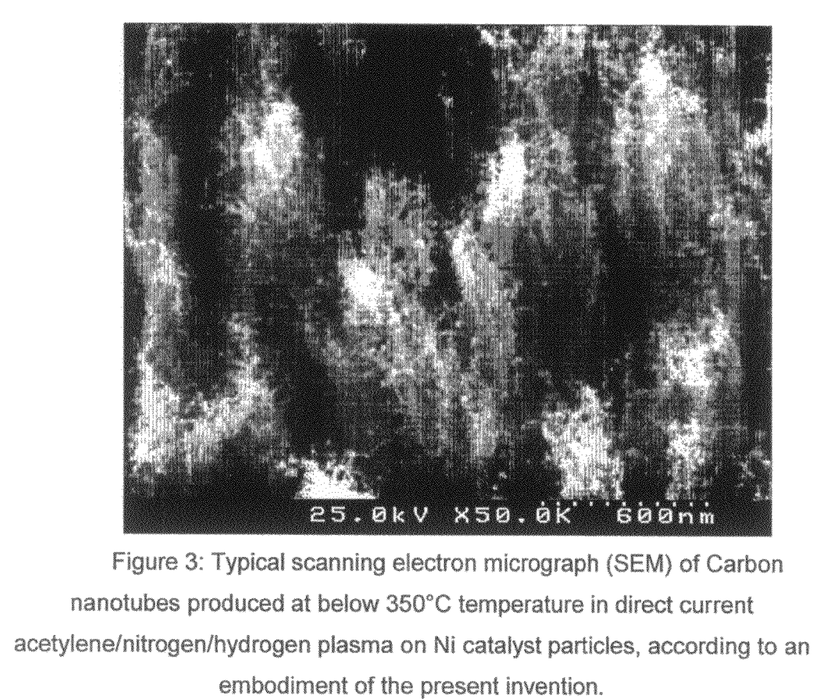
FIG. 3 is a typical scanning electron micrograph (SEM) of carbon nanotubes produced at below 350° C. temperature in direct current acetylene/nitrogen/hydrogen plasma on Ni catalyst particles, according to an example.

An SEM micrograph of carbon nanotubes grown on a substrate kept at 350° C. in a direct current PECVD is provided in FIG. 3. The carbon nanotubes bundle together for support although it will be obvious to a skilled person that the alignment can be controlled via the applied voltage.

Figure 4:
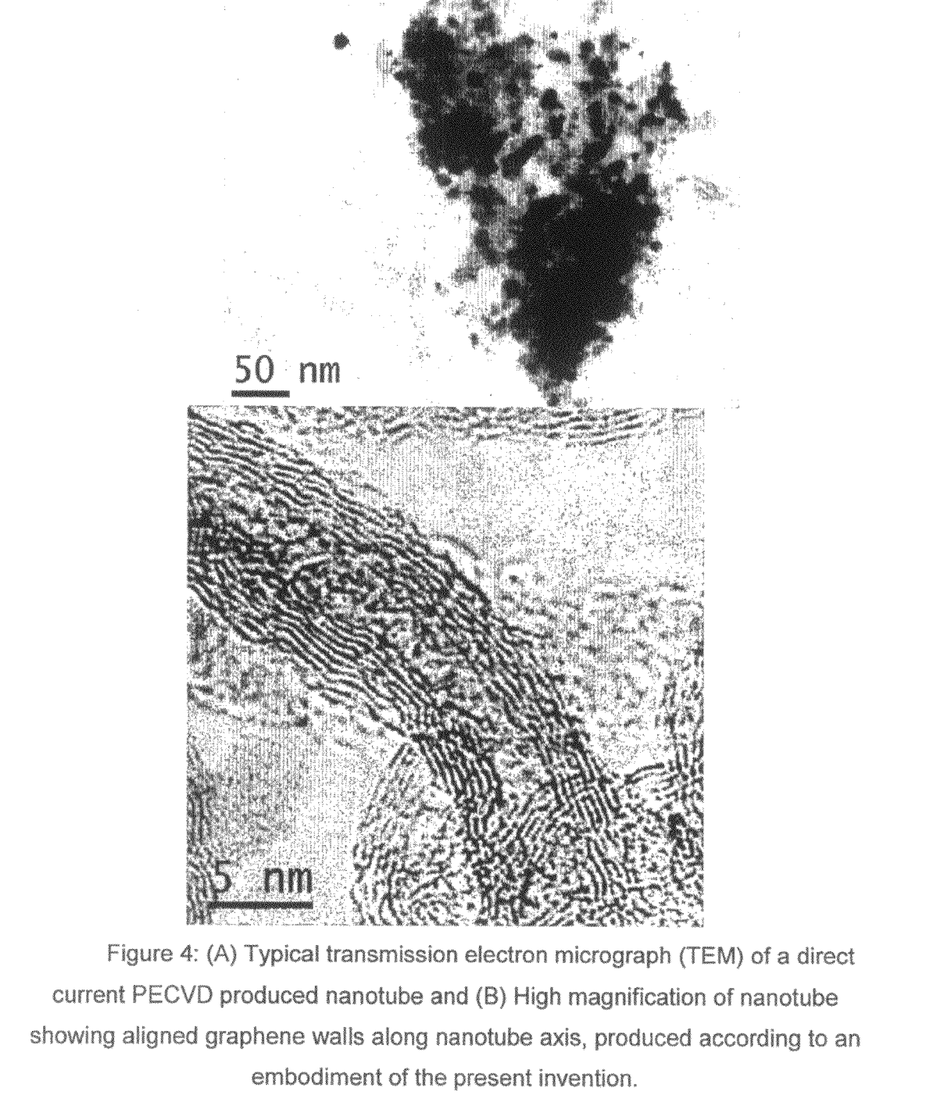
FIG. 4A is a typical transmission electron micrograph (TEM) of a direct current PECVD produced nanotube, produced according to an example.
FIG. 4B is a typical TEM of a direct current PECVD produced nanotube showing aligned graphene layers along the nanotube axis, produced according to an example.

TEM studies have shown the bundle of the produced nanotubes. A typical TEM of a direct current PECVD produced nanotube is shown in FIG. 4A. FIG. 4B shows the high magnification image of the carbon nanotube, revealing the multi-layered graphene walls of the nanotube, aligned to the tube axis. The interlayer spacing of 0.34 nm, typical for graphene sheets along the CNT axis was found. The typical lengths of carbon nanotubes produced varied from 0.5 to 5 μm, with diameters ranging from 5 to 15 nm. Adjusting the process parameters such as deposition times, gas flows, catalyst particle conditions, gas concentrations, etc may vary the length and thickness of carbon nanotubes.

It has been shown from the discussed method that direct current plasmas can produce carbon nanotubes, which grow on a substrate 15 kept at a temperature below 350° C. and possibly down to room temperature while maintaining low defect levels. This low temperature plasma enhanced CVD method is suitable for growing well aligned carbon nanotubes selectively by using the metal catalytic effect, where the temperature at the point of carbon nanotube growth permits the use of temperature sensitive substrates or where low defect carbon nanotubes are desired.

Figure 5:
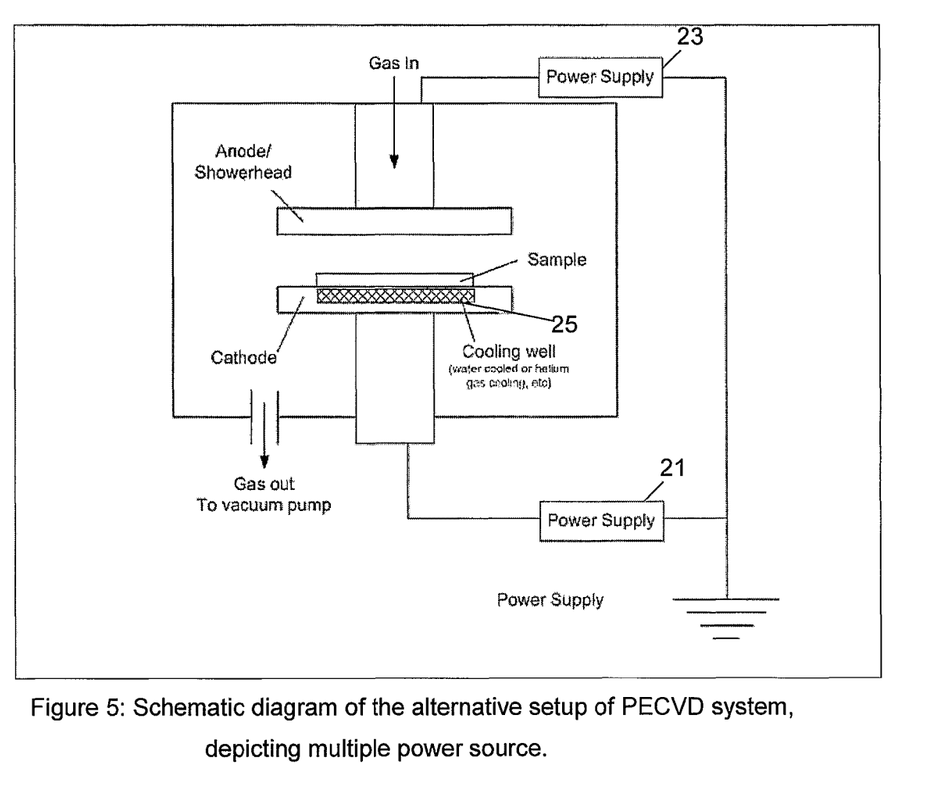
FIG. 5 shows a Schematic diagram of an alternative setup of PECVD system comprising multiple power sources.

It should also be obvious to a skilled person that the setup is not limited to the setup described in this example. FIG. 5 shows a modified setup where multiple power sources 21, 23 are deployed to provide the plasma heating while consisting of a cooling mechanism 25. In other possible setups not described in this embodiment, the energy source can also be provided in the form of optical (e.g. lasers, halogen lamps, etc), resistive heating (e.g. filaments, etc) and other forms.

Description of Second Example

The second example allows the deposition of low defect level carbon nanotubes at low substrate temperature below 350.degree. C. in the application of interconnects 27 used in microelectronics. Interconnects are used in integrated circuits for carrying large current densities. A suitable material would be the carbon nanotubes due to its covalent structure not subscribing to much electromigration, high current carrying capacity and ballistic electron transport capabilities giving rise to low resistivities for high current flows. Microelectronic processes often require substrate temperatures to be kept below 450° C. to prevent excessive diffusion of dopants through the increased creation of vacancies in silicon.

Figure 6:
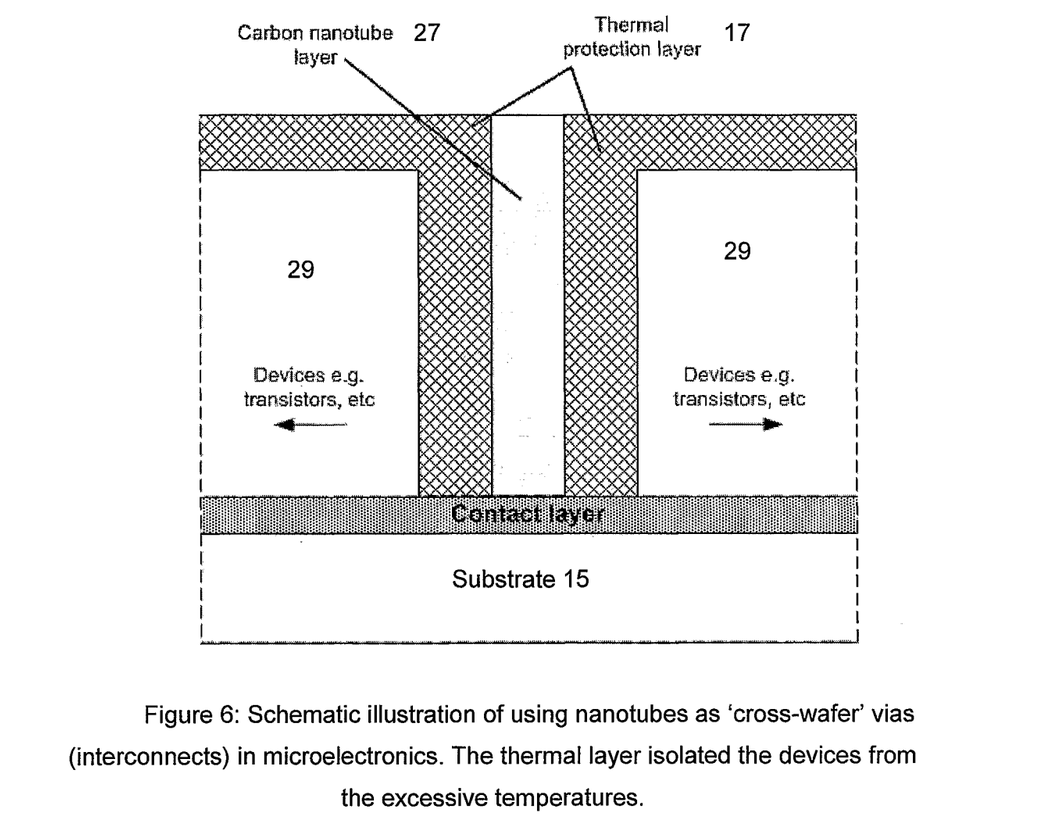
FIG. 6 is a schematic illustration of using carbon nanotubes as a 'cross wafer' via (interconnects) in microelectronics, the thermal layer isolating the devices from the excessive temperatures.

FIG. 6 shows the use of low thermal conductivity materials to isolate the heating from the neighbouring devices 29 such as transistors, etc. The location of the interconnect 27 can be defined through existing lithography techniques.

The thermal barrier layer 17 can be laid down using standard deposition technique and effectively covers the area to be protected. The catalyst 19 is laid down at the location where the carbon nanotubes are to be deposited.

Plasma or top heating techniques are employed to synthesise the carbon nanotubes. The thermal barrier layer 17 creates a thermal gradient which prevents excessive heat from reaching the neighbouring devices.

After the carbon nanotubes are grown, the top surface can be removed by chemical mechanical polishing (if required) for further deposition of the top contact layer. Mixed carbon nanotube-metal interconnects too could be used for enhancement of the conduction process from the current state of the art. This would be achieved once the aligned carbon nanotubes are grown, a back fill of a suitable metal is deposited to help with the conduction further. Interconnects 27 to communicate 'electrons' between layers on a single integrated circuit can also be envisaged. In this case, the carbon nanotubes are grown in pre-defined vias (holes generally filled with a metal such as copper), where first a barrier layer will be put down and on top of this a catalyst layer to facilitate the growth of carbon nanotubes at low temperature is deposited. This metal growth could be via a solution process such as electrodeposition, or physical process such as sputtering or evaporation. Once suitable lengths of carbon nanotubes have been grown, mechanical polishing such as CMP may be required to planarise the surface. A further metal layer may also be required to connect up the nanotubes to the desired metal tracks on the integrated circuit.

Description of Third Example

Figure 7:
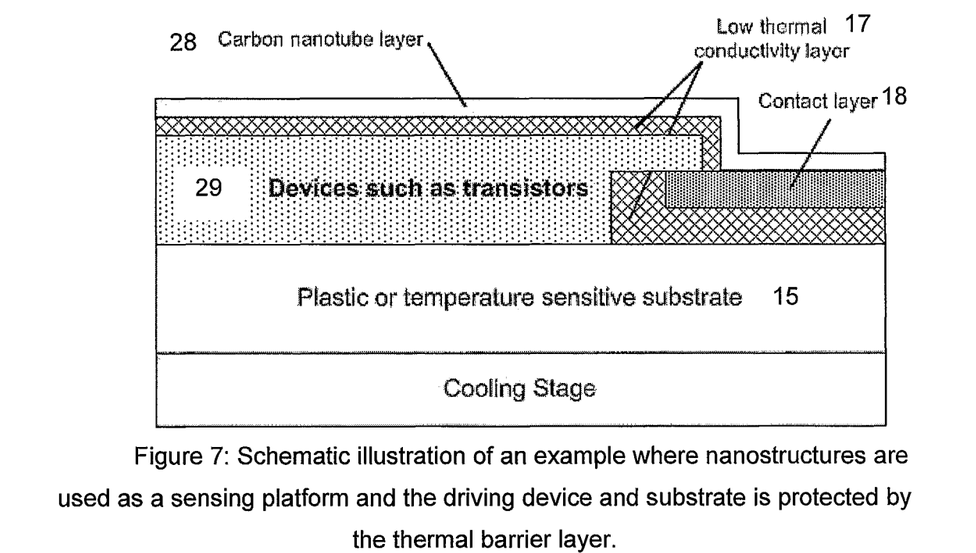
FIG. 7 is a schematic illustration of an example where nanostructures are used as a sensing platform and the driving device and substrate is protected by the thermal barrier layer.

The third example allows the deposition of carbon nanotubes or alternative nanowires in a layer 28 at low substrate temperature below 350° C. in the application of sensing platforms. Carbon nanotubes or other nanowires are utilised as materials for chemical, mechanical, etc sensors due to their unique properties and high aspect ratio (which results in increased surface area). In this example, a temperature sensitive substrate 15 such as plastic is used. A plurality of devices 29 are provided on the substrate 15. The use of temperature sensitive materials is not limited to substrates and can be extended to active devices such as organic transistors used in the application.

Referring to FIG. 7, the thermal barrier layer 17 can be described as enclosing the device region. The catalyst is laid on the required region and NTs are deposited using a similar technique as the first embodiment. A contact layer 18 is provided for connecting the devices 29 provided on the substrate 15.

The top down heating and bottom cooling method effectively protects both the device region and the substrate. The NT thus deposited can now be utilised in its present form or by functionalisation of the surface via a chemical process. With suitable functionalisation, it may be used to detect viruses, antibodies or gases. It may also be used for harvesting of energy via the surrounding environment in chemical batteries, or harvesting of solar energy with suitable coating layers. Pressure transducers may also be fabricated that work on the signals associated with the deformation of the NTs. The NTs may also be used to transmit RF signals, or act as miniature bio-potential sensors in say EEG or ECG devices. The person skilled in the art could invent many device structures that utilise this platform technology for many applications.

The use of the thermal barrier layer 17 allows large area deposition of the NTs which effectively increases the efficiency of the sensor.

Description of Embodiment of the Invention

The invention according to the following embodiment allows the deposition of low defect level carbon nanotubes, though not specifically, at low substrate temperature below 350° C. It should be clear to a skilled person that the invention can be extended to other materials. An optical heating source in the form of one or more Infrared-Red lamps is employed in this embodiment.

Figure 8:
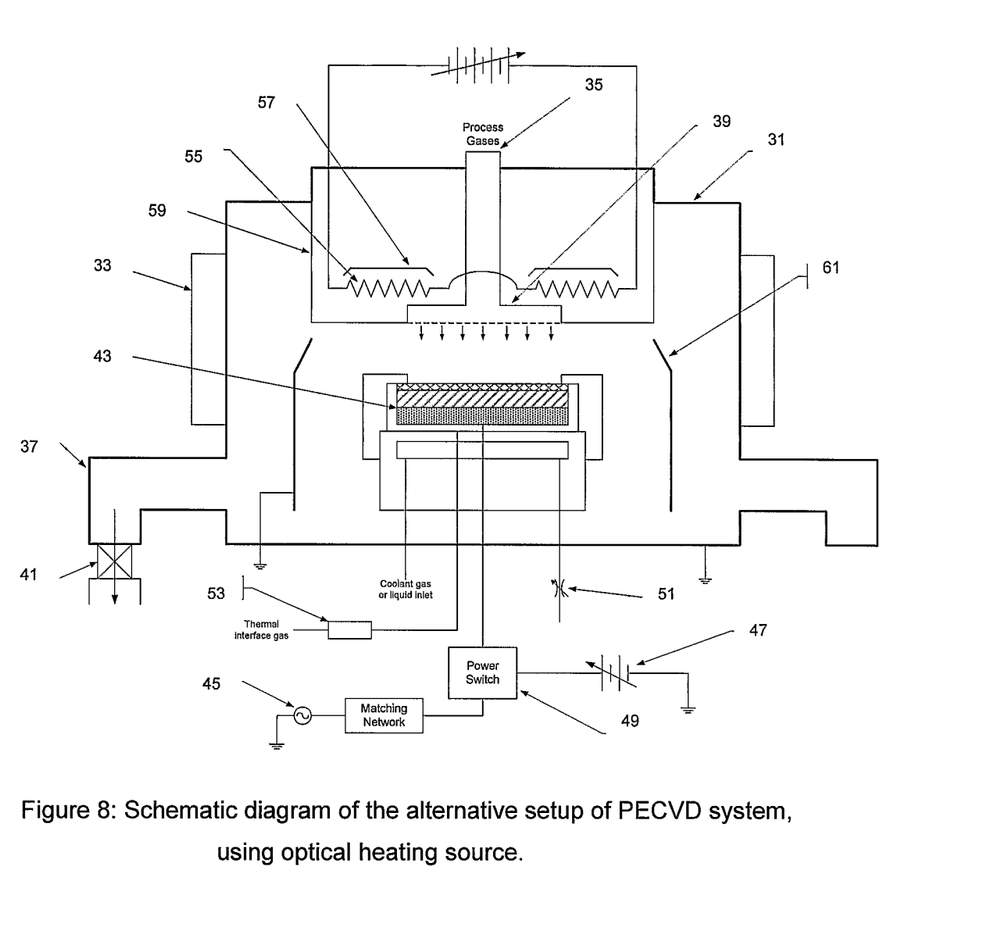
FIG. 8 is a schematic illustration of a suitable plasma chamber with integrated optical heating source for the forming and growing the carbon nanotubes upon a substrate according to an embodiment of the present invention.

Referring to FIG. 8, the PECVD system comprises a chamber 31 which houses the components of the system. The chamber 31 wall can be warmed or cooled 33 depending on process requirements. The system primarily comprises a gas inlet 35 and outlet 37. The process gases enter via the inlet 35 and are evenly distributed through a showerhead 39. Process pressure is then maintained through the use of a throttle valve 41 located at the gas outlet 37, before the pumping system. Gas distribution uniformity can be further improved by manifold pumping of the process chamber.

Power is delivered to the plasma via an electrode 43 which allows the sample to be thermally attached to a cooling stage. The power delivered can be in the form of RF 45 or DC 47 supply, which is controlled via a power switch 49. The cooling stage can be driven by any coolant gas or liquid and therefore the substrate temperature is controlled by the coolant flow 51. The transfer of heat from the substrate to the cooling stage can be further optimised by control of a thermal interface gas such as hydrogen 53. The heating source is in the form of optical heating which is provided by Infrared Red (IR) lamps 55. The optical heating can be further optimised using reflectors 57 to direct the IR to the sample. It should be obvious to a person skilled in the art that the optical source wavelength can be tuned to provide optimum heating.

The optical heating source is integrated into the shower head in this embodiment. The plasma can be generated using either the showerhead assembly 59 or shield 61 or the chamber 31 as the anode. The plasma in this instance would be used for the alignment of the nanotubes.

The thermal control barrier in this embodiment would be based on thermal conductivity or optical properties such as emissivity or absorption. It should be obvious to a person skilled in the art that the choice of thermal control using barrier film would be subjected to the heating source. The barrier film in this particular embodiment would thus be able to optimise heat absorption to the catalyst while reflecting (optically) or retarding the transfer of heat to the substrate.

Figure 9:
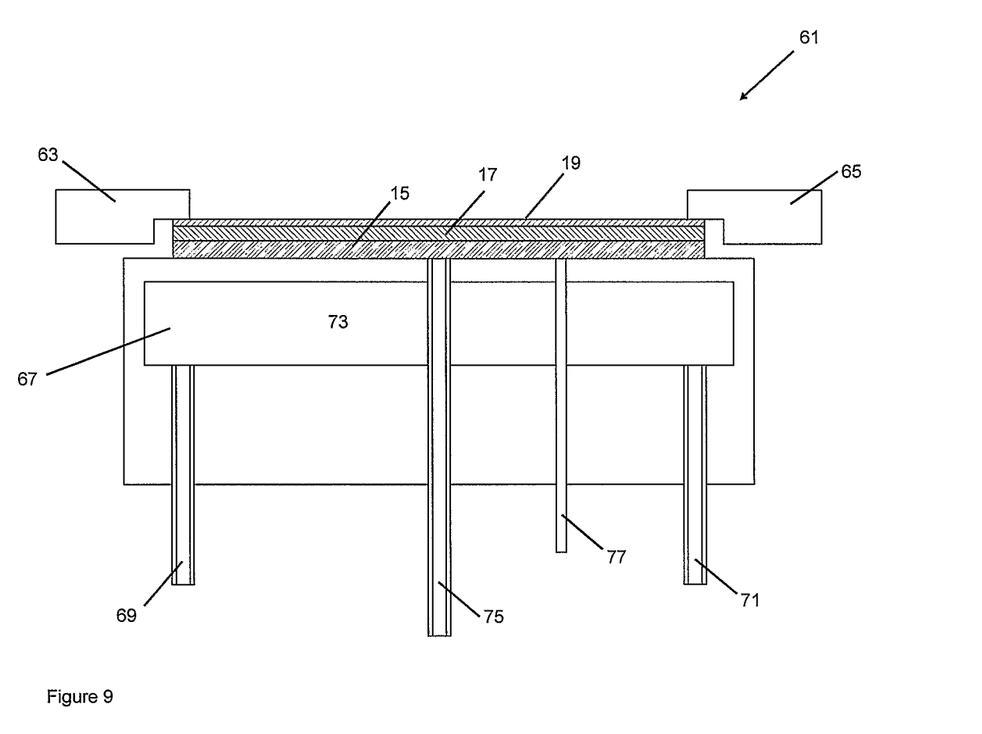
FIG. 9 is a schematic illustration of a chuck for the plasma chamber shown in FIG. 8.

The substrate 15 is fixedly mounted in a chuck 61 by first and second clamping members 63, 65, as shown in FIG. 9. The chuck 61 is provided with a cooling well 67 having an inlet 69 and an outlet 71. Coolant fluid 73 is introduced into the cooling well 67 through the inlet 69 and exits through the outlet 71 to provide uniform, controllable back side cooling of the substrate 15. The chuck 61 is preferably interchangeable with other chucks (not shown).

As discussed above, the transfer of heat from the substrate to the chuck 61 can be further optimised by providing a thermal interface gas 53. In the present embodiment the thermal interface gas is hydrogen 53 which is supplied into the region between the substrate 15 and the chuck 61 through a gas supply conduit 75. The thermal interface gas 53 is preferably supplied to a central region of the substrate 15 and allowed to vent into the chamber 31 at the outside edge of the substrate 15. The thermal interface gas 53 is typically supplied at a pressure greater than or equal to one and a half (1.5) times the process pressure inside the chamber 31.

At least one temperature sensor 77 is provided to measure the temperature of the lower surface of the substrate 15.

It will be appreciated that various changes and modifications may be made to the apparatus and processes described herein with departing from the scope or spirit of the present invention.

The invention claimed is:

1. A method of forming nanostructures or nanomaterials including the steps of:
    providing a thermal control barrier as a substantially continuous layer on a substrate;
    providing a gas plasma;
    providing heating at the thermal control barrier from above the layer by a heating source distinct from the gas plasma, wherein the heating source is an optical heating source; and
    forming the nanostructures or nanomaterials on the substrate atop the layer by plasma enhanced chemical vapour deposition using the gas plasma during said heating.

2. A method according to claim 1, wherein the method is for producing nanostructures which are carbon nanotubes or carbon nanowires and wherein the step of forming the nanostructures uses a carbon containing gas plasma.

3. A method according to claim 1, wherein the temperature of the substrate is less than 350° C. while the nanostructures or nanomaterials are formed.

4. A method according to claim 1, wherein a catalyst is provided on the thermal control barrier in a substantially continuous layer before the nanostructures or nanomaterials are formed or simultaneously with the formation of the nanostructures or nanomaterials.

5. A method according to claim 1, wherein the thermal control barrier is deposited on the substrate.

6. A method according to claim 1, wherein the thermal control barrier has a thickness of greater than or equal to 3 nm.

7. A method according to claim 1, wherein the thermal control barrier is a layer of metal, semiconductor or dielectric material.

8. A method according to claim 1, comprising the step of providing a catalyst on the thermal control barrier.

9. A method according to claim 8, wherein the catalyst is a metal, or mixture of metals.

10. A method according to claim 1, further comprising the step of uniformly cooling the substrate.

11. A method according to claim 10, wherein a second surface of the substrate is cooled while said nanostructures or nanomaterials are formed on a first surface of said substrate.

12. A method according to claim 11, comprising supplying a coolant fluid to a cooling well to cool the substrate.

13. A method according to claim 11, comprising the step of introducing a gas at the interface between said second surface and a surface on which the substrate is supported.

14. A method according to claim 13, wherein said gas is hydrogen.

15. A method according to claim 10, comprising supplying a coolant fluid to a cooling well to cool the substrate.

16. A method according to claim 15, comprising the step of introducing a gas at the interface between said second surface and a surface on which the substrate is supported.

17. A method according to claim 16, wherein said gas is hydrogen.

18. A method according to claim 1, wherein said thermal control barrier is optically reflective.

19. A method according to claim 1, wherein the thermal control barrier is a thermal insulator.

20. A method according to claim 1, comprising providing at least one device on the substrate.

21. A method according to claim 20, wherein the thermal control barrier is provided over said at least one device.

22. A method according to claim 21, wherein said at least one device is at least substantially covered by said thermal control barrier.

23. A method according to claim 20, wherein the device is an electronic component.

24. A method according to claim 23, wherein the electronic component is a transistor.

25. A method according to claim 1, wherein the steps are repeated to form a multilayered structure.

26. A method according to claim 1, wherein said substrate is a plastics material.

27. A method according to claim 1, further comprising the step of controlling an electric field across the substrate to align the nanostructures or nanomaterials.

* * * * *